United States Patent
Hsieh (10) Patent No.: US 9,792,975 B1
(45) Date of Patent: Oct. 17, 2017

(54) DRAM AND ACCESS AND OPERATING METHOD THEREOF

(71) Applicant: MediaTek Inc., Hsin-Chu (TW)

(72) Inventor: Bo-Wei Hsieh, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/191,396

(22) Filed: Jun. 23, 2016

(51) Int. Cl.
*G11C 7/22* (2006.01)
*G11C 11/4076* (2006.01)
*G11C 11/4096* (2006.01)
*G11C 11/408* (2006.01)
*G11C 11/419* (2006.01)

(52) U.S. Cl.
CPC ...... *G11C 11/4076* (2013.01); *G11C 11/4087* (2013.01); *G11C 11/4096* (2013.01); *G11C 7/22* (2013.01); *G11C 11/419* (2013.01)

(58) Field of Classification Search
CPC ............ G11C 11/4076; G11C 11/4087; G11C 11/4096; G11C 7/22; G11C 11/419
USPC ................... 365/191, 230.01, 230.03, 230.09
See application file for complete search history.

(56) References Cited

U.S. PATENT DOCUMENTS

| | | | |
|---|---|---|---|
| 4,228,496 A * | 10/1980 | Katzman | G06F 12/1458 700/82 |
| 8,225,064 B2 | 7/2012 | Hosokawa | |
| 8,792,294 B2 | 7/2014 | Liu | |
| 8,966,164 B1 * | 2/2015 | Asnaashari | G06F 12/0246 711/103 |
| 9,432,298 B1 * | 8/2016 | Smith | H04L 49/9057 |
| 2005/0168469 A1 * | 8/2005 | Sohn | G09G 5/39 345/530 |
| 2006/0179369 A1 * | 8/2006 | Bravo | G11C 29/16 714/718 |
| 2007/0028031 A1 * | 2/2007 | Peterson | G06F 9/4403 711/103 |
| 2010/0174955 A1 * | 7/2010 | Carnevale | G11C 5/04 714/718 |
| 2013/0036273 A1 * | 2/2013 | Shaeffer | G06F 13/16 711/148 |
| 2017/0117030 A1 * | 4/2017 | Fisch | G11C 11/4087 |

* cited by examiner

*Primary Examiner* — Ly D Pham
(74) *Attorney, Agent, or Firm* — McClure, Qualey & Rodack, LLP (57) ABSTRACT

An access method for a DRAM is provided. A plurality of portions of a row address of a bank corresponding to a activate command is provided. A plurality of sub-commands of the activate command are provided via a command bus, and a plurality of portions of address information regarding the portions of the row address are provided via an address bus. Each portion of the address information includes an individual portion of the row address of the bank. Each first sub-command corresponds to an individual address information. A specific sub-command of the activate command is provided via the command bus, and address information regarding a specific portion of the row address is provided. An access command corresponding to the bank is provided via the command bus after the sub-commands are provided.

11 Claims, 9 Drawing Sheets

|  | CS | ADDR[0] | ADDR[1] | ADDR[2] | ADDR[3] | ADDR[4] | ADDR[5] | ADDR[6] |
|---|---|---|---|---|---|---|---|---|
| ROW_addr1 | H | IND[1:0] | | BA[2:0] | | | TRI | ROW[15] |
| | L | ROW[14:8] | | | | | | |
| ROW_addr2 | H | IND[1:0] | | BA[2:0] | | | TRI | ROW[7] |
| | L | ROW[6:0] | | | | | | |

DRAM AND ACCESS AND OPERATING METHOD THEREOF

BACKGROUND OF THE INVENTION

Field of the Invention

The invention relates to a dynamic random access memory (DRAM), and more particularly, to an access and operating method of a DRAM.

Description of the Related Art

Dynamic random access memory (DRAM) technology has existed for several years. The dramatic increase in DRAM storage capacity has been made possible by advances in semiconductor fabrication technology and circuit design technology. Considerable advances have also resulted in higher and higher levels of integration that permit dramatic reductions in memory array size and cost, as well as increased process yield.

Modern DRAM semiconductor memories require more area on semiconductor chips, despite the fact that structures for the rapidly increasing memory capacities are becoming smaller, and their memory cell fields are becoming larger. The area requirements are associated with considerable production costs. Apart from the memory cell fields, a significant proportion of the area of a semiconductor memory chip is occupied by control, address and data lines, some of which are disposed alongside the memory cell fields and are becoming wider with the increasing memory capacity of the semiconductor memory, and by control devices which are required for operation of the data memory.

A DRAM receives a plurality of input signals from a controller, wherein the input signals define parameters such as the location, or address, of the memory data and transmit the memory data. A read or write transaction with a DRAM generally involves two steps. First, address (e.g. row address and column address) and control signals are transmitted to the DRAM, allowing the DRAM to prepare for the data transfer. Second, the DRAM reads or writes the data, completing the data transfer. When the read or write transaction is performed, the buses between the DRAM and the controller will be occupied

BRIEF SUMMARY OF THE INVENTION

A dynamic random access memory (DRAM) and access and operating methods thereof are provided. An embodiment of an access method for a DRAM is provided. A plurality of portions of a first row address of a first bank corresponding to a first activate command is provided. A plurality of first sub-commands of the first activate command are provided via a command bus, and a plurality of portions of address information regarding the portions of the first row address are provided via an address bus, wherein each portion of the address information comprises an individual portion of the first row address of the first bank, and each of the first sub-commands corresponds to an individual address information. A specific sub-command of the first activate command is provided via the command bus, and address information regarding a specific portion of the first row address is provided via the address bus. An access command corresponding to the first bank is provided via the command bus after the first sub-commands are provided.

Moreover, an embodiment of an operating method for a DRAM is provided. A plurality of first sub-commands of a first activate command are obtained via a command bus, and a plurality of first address information regarding a plurality of first portions of a first row address of a specific bank are obtained via an address bus, wherein each of the first sub-commands corresponds to an individual first portion of the first row address of the specific bank. The first portions of the first row address of the specific bank are combined in response to a specific sub-command of the first sub-commands, so as to obtain a first complete row address. An access command is obtained via the command bus from the controller.

Furthermore, an embodiment of a DRAM is provided. The DRAM comprises an address combination circuit, and a column address decoder. The address combination circuit comprises a control unit, a first selector, and a second selector. The control unit provides a bank address and a trigger signal according to address information from a controller via an address bus. The first selector stores a portion of a row address of the address information into the storage unit according to the bank address. The second selector provides a complete row address from the storage unit according to the bank address and the trigger signal. The column address decoder obtains a column address from the controller via the address bus according to an access command from the controller via the command bus. When the access command is a write command, first data from the controller via a data bus is received and stored according to the complete row address and the column address, and when the access command is a read command, second data corresponding to the complete row address and the column address is provided to the controller via the data bus A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
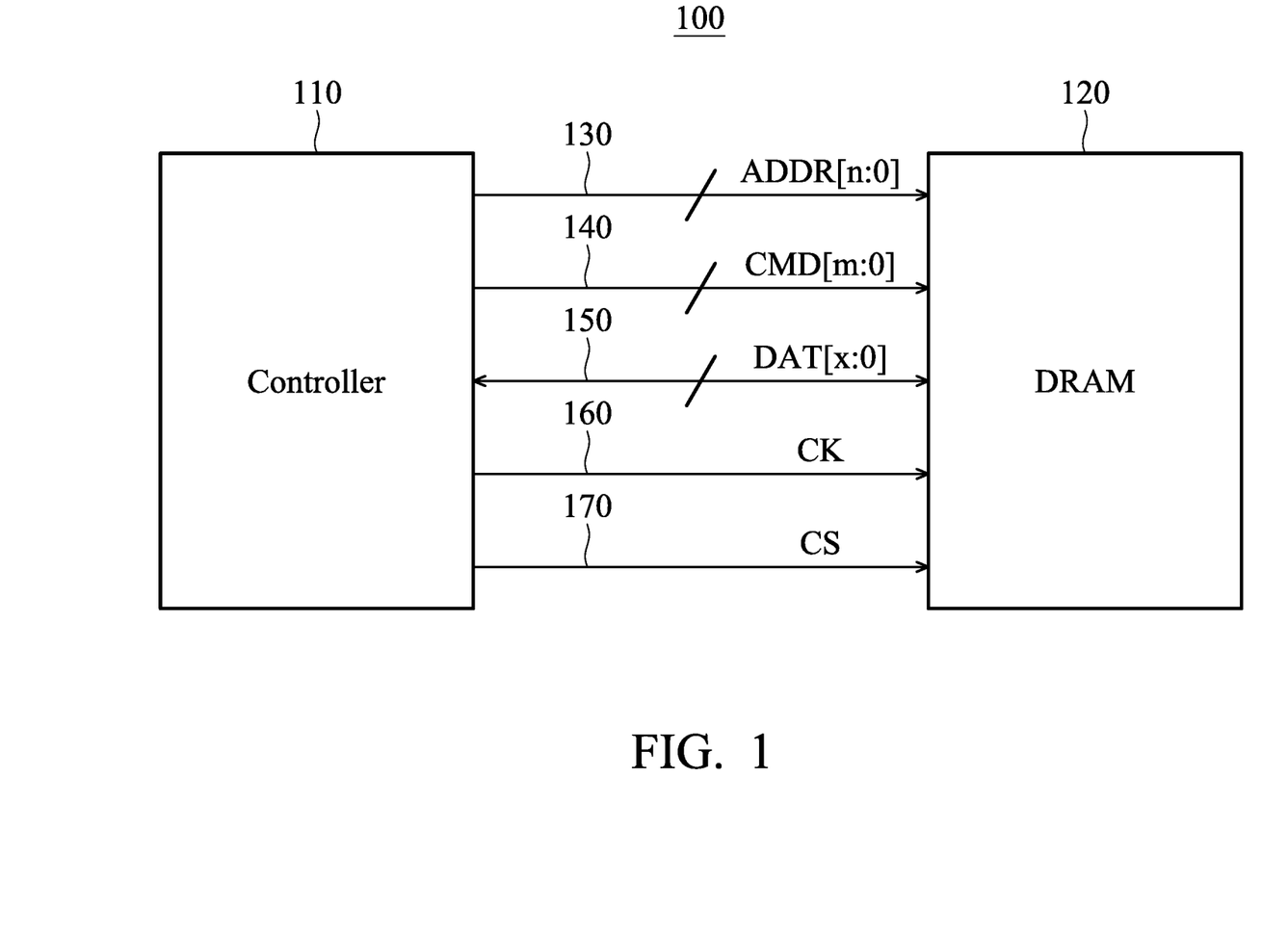
FIG. 1 shows an electronic device according to an embodiment of the invention.

FIG. 1 shows an electronic device 100 according to an embodiment of the invention. The electronic device 100 comprises a controller 110 and a dynamic random access memory (DRAM) 120. Furthermore, the electronic device 100 further comprises a plurality of buses 130, 140 and 150 between the controller 110 and the DRAM 120. The bus 130 is an address bus for providing an address signal ADDR[n:0] from the controller 110 to the DRAM 120. The bus 140 is a command bus for providing a command signal CMD[m:0] from the controller 110 to the DRAM 120. The bus 150 is a data bus for transferring a data signal DAT[x:0] between the controller 110 and the DRAM 120. Furthermore, the electronic device 100 further comprises the transmission lines 160 and 170 between the controller 110 and the DRAM 120. The transmission line 160 is used to provide a clock signal CK from the controller 110 to the DRAM 120. The transmission line 170 is used to transfer a chip select signal CS from the controller 110 to the DRAM 120. It is to be noted that the address bus 130 is formed by a plurality of address lines, and the quantity of address lines is smaller than the maximum number of bits of the row address and the column address, which is to be provided to the DRAM 120. Thus, pin counts of the controller 110 and the DRAM 120 are reduced.

Figure 2:
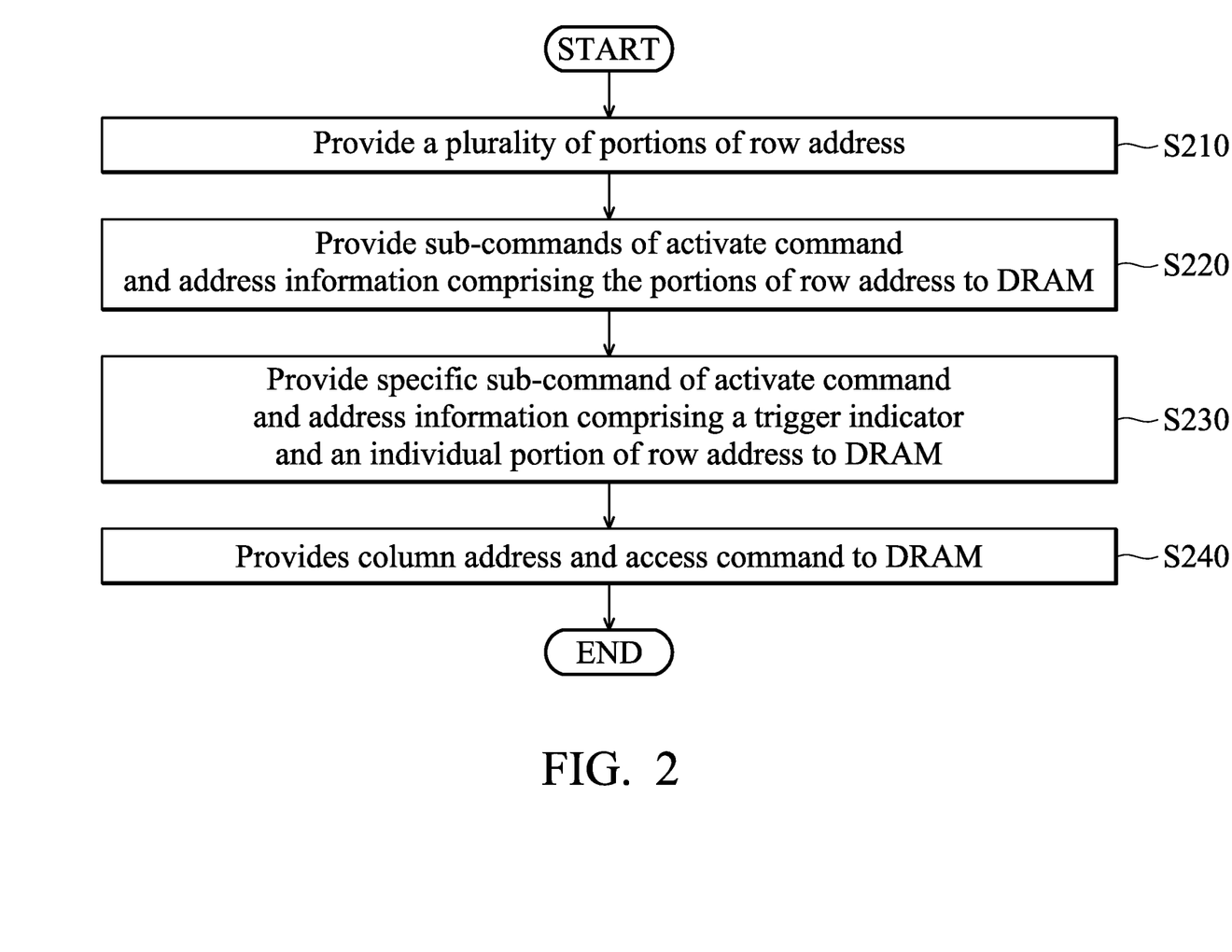
FIG. 2 shows an access method for a DRAM according to an embodiment of the invention, wherein the access method is performed by a controller.
Figure 3:
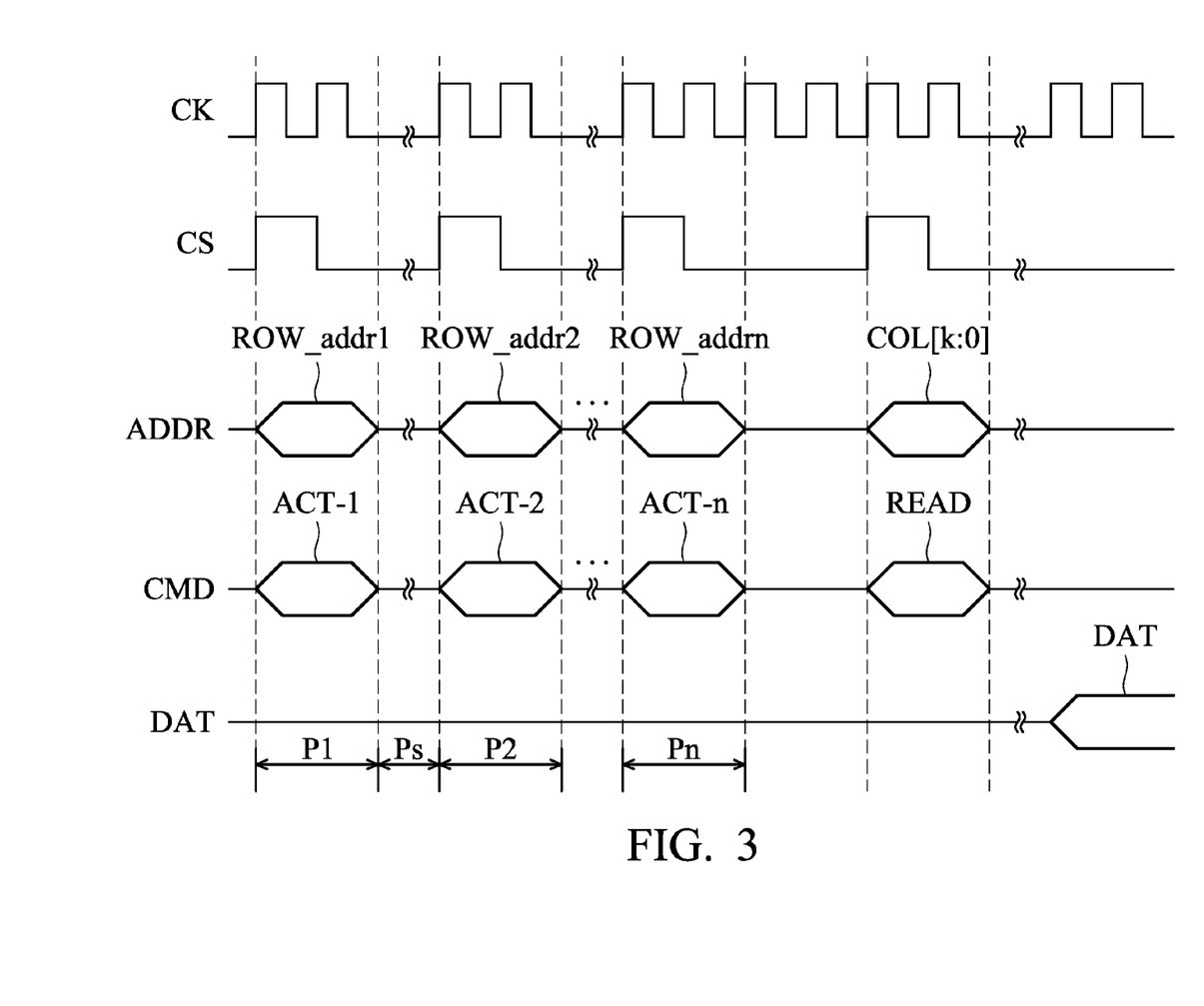
FIG. 3 shows a waveform illustrating the signals of the controller of FIG. 2 according to an embodiment of the invention.

FIG. 2 shows an access method for a DRAM (e.g. 120 of FIG. 1) according to an embodiment of the invention, wherein the access method is performed by a controller (e.g. 110 of FIG. 1). FIG. 3 shows a waveform illustrating the signals of the controller of FIG. 2 according to an embodiment of the invention. Referring to FIG. 2 and FIG. 3 together, first, in step S210, a row address ROW[y:0], which is to be transmitted to the DRAM, comprises a plurality of portions, wherein each portion comprises the same number or different number of bits in the row address. In some embodiments, the row address ROW[y:0] is partitioned/divided into the plurality of portions. In some embodiments, row address ROW[y:0] is formed by the plurality of portions. Next, in step S220, the controller provides a plurality of sub-commands ACT-1 to ACT-(n−1) of an activate command ACT to the DRAM via a command bus (e.g. 140 of FIG. 1). Simultaneously, the controller provides address information ROW_addr1-ROW_addr(n−1) to the DRAM via an address bus (e.g. 130 of FIG. 1), wherein each of the address information ROW_addr1-ROW_addr(n−1) comprises an individual portion of the row address ROW[y:0] corresponding to the sub-command. For example, the controller provides the address information ROW_addr1 associated with the sub-command ACT-1 in phase P1. Furthermore, the controller provides the address information ROW_addr2 associated with the sub-command ACT-2 in phase P2, and so on. Next, in step S230, the controller provides a specific sub-command ACT-n of the activate command ACT to the DRAM via the command bus. Simultaneously, the controller provides the address information ROW_addrn to the DRAM via the address bus, wherein the address information ROW_addrn comprises a trigger indicator and an individual portion of the row address ROW[y:0] corresponding to the specific sub-command. For example, the controller provides the address information ROW_addrn associated with the sub-command ACT-n in phase Pn. It should be noted that the sub-commands ACT-1 to ACT-n are separated from each other by an idle phase Ps. Therefore, no more than 2 consecutive clock cycles are occupied in the buses between the controller and the DRAM for the activate command ACT. In some embodiments, the command bus (e.g. 140 of FIG. 1) is idle in the idle phase Ps, i.e. no command signal CMD is transmitted, such as a no operation (NOP) instruction or a deselect instruction is performed for the DRAM. Furthermore, in some embodiments, the controller can provide other command to the DRAM in the idle phase Ps. For example, a sub-command of another activate command corresponding to another bank can be provided to the DRAM in the idle phase Ps. Furthermore, no portion of the row address ROW[y:0] is provided to the DRAM in the idle phase Ps. In the embodiment, the specific sub-command is the last sub-command ACT-n transmitted to the DRAM. Furthermore, compared with the address information ROW_addr1-ROW_addr(n−1), the specific address information ROW_addrn further comprises the trigger indicator. Next, in step S240, the controller provides a column address COL[k:0] to the DRAM via the address bus. Simultaneously, the controller provides an access command to the DRAM via the command bus. In the embodiment, the access command is a read command READ, and the DRAM provides the data DAT corresponding to the row address ROW[y:0] and the column address COL[k:0] to the controller via the data bus in response to the read command READ. In one embodiment, if the access command is a write command WRITE, the controller further provides the data to be stored, to the DRAM, and then the DRAM stores the data from the controller according to the row address ROW[y:0] and the column address COL[k:0]. It is to be noted that the number of bits of the row address ROW[y:0] is greater than the quantity of address lines of the address bus, and the number of bits of the column address COL[k:0] is smaller than or equal to the quantity of address lines of the address bus. Furthermore, the quantity of address information ROW_addr1-ROW_addrn is equal to the quantity of sub-commands ACT-1 to ACT-n, i.e. the quantity of portions of the row address ROW[y:0] is equal to the quantity of sub-commands ACT-1 to ACT-n.

Figure 4:
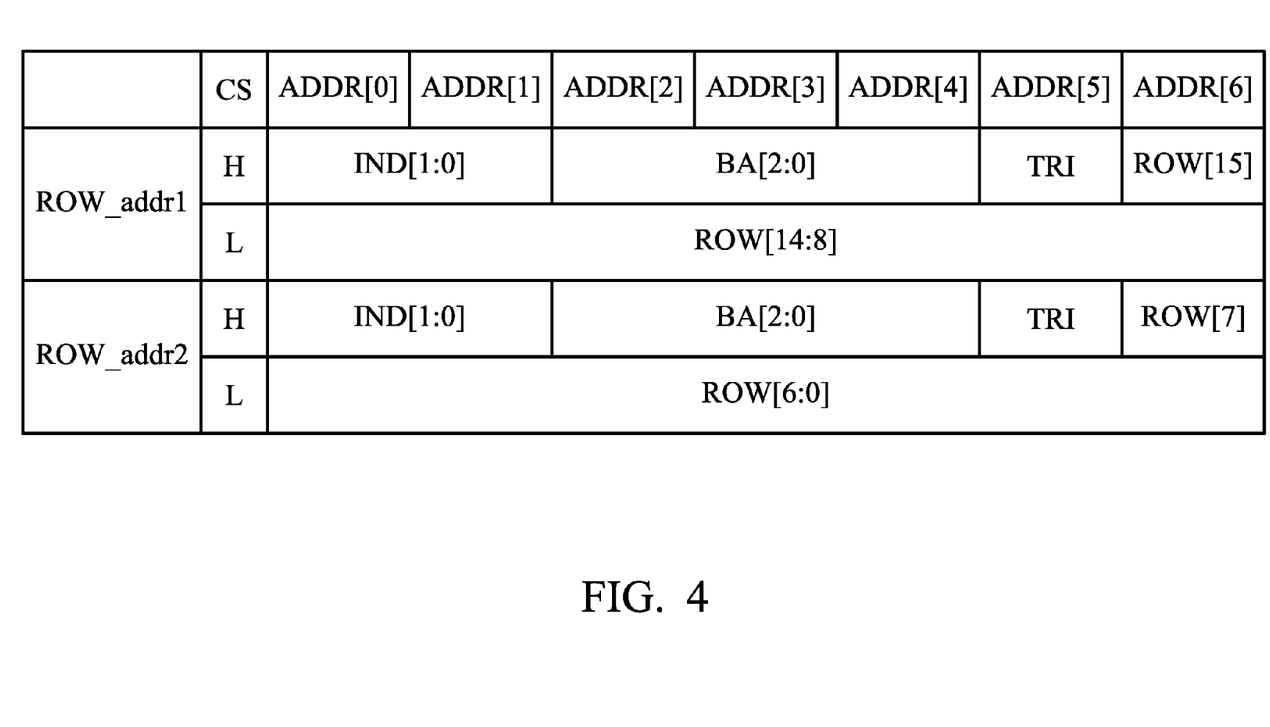
FIG. 4 shows a table illustrating a configuration of address information ROW_addr1 and ROW_addr2 corresponding to an activate command ACT according to an embodiment of the invention.

FIG. 4 shows a table illustrating a configuration of address information ROW_addr1 and ROW_addr2 corresponding to an activate command ACT according to an embodiment of the invention. In the embodiment, the activate command ACT is composed of two sub-commands ACT-1 and ACT-2. Furthermore, a row address ROW[15:0] comprises a first portion and a second portion. The first portion of the row address ROW[15:0] comprises a plurality of most significant bits of the row address ROW[15:0], i.e. the high row address ROW[15:8], and the second portion of the row address ROW[15:0] comprises the remnant bits of the row address ROW[15:0], i.e. the low row address ROW[7:0]. Referring to FIG. 3 and FIG. 4 together, when the sub-command ACT-1 is provided to the DRAM via a command bus, the address information ROW_addr1 is simultaneously provided to the DRAM via an address bus, and the address information ROW_addr1 comprises the high row address ROW[15:8]. Furthermore, when the sub-command ACT-2 is provided to the DRAM via the command bus, the address information ROW_addr2 is simultaneously provided to the DRAM via the address bus, and the address information ROW_addr1 comprises the low row address ROW[7:0]. In the embodiment, the address information ROW_addr1 comprises two parts, wherein a first part of the address information ROW_addr1 is provided to the DRAM when the chip select signal CS is at a high logic level (i.e. "H"), and a second part of the address information ROW_addr1 is provided to the DRAM when the chip select signal CS is at a low logic level ("L"). For example, the first part of the address information ROW_addr1 comprises an index IND [1:0], a bank address BA[2:0], a trigger bit TRI, and the row address ROW[15], and the second part of the address information ROW_addr1 comprises the row address ROW [14:8]. In the embodiment, the index IND[1:0] indicates the identification of the address information, wherein each address information has an individual value of the index IND[1:0]. For example, the index IND[1:0] of the address information ROW_addr1 is a first index value (e.g. "HL"), and the index IND[1:0] of the address information ROW_addr2 is a second index value (e.g. "HH") different from the first index value. According to the individual value of the index IND[1:0], the DRAM can identify which bits of the row address ROW[15:0] are presented in the address information. Furthermore, the bank address BA[2:0] indicates a bank address of a specific bank to be accessed. The trigger bit TRI indicates whether a trigger indicator is present in the address information, and the trigger indicator is used to represent that the address information is the last address information for the activate command ACT. For example, if the trigger bit TRI is at a low logic level, the trigger indicator is absent. On the contrary, if the trigger bit TRI is at a high logic level, the trigger indicator is present. If the DRAM receives a specific address information with the trigger indicator, the DRAM will ignore the subsequent address information for the activate command ACT, and the DRAM will obtain the row address corresponding to the activate command ACT according to the specific address information and the address information received before the specific address information. Similarly, the address information ROW_addr2 comprises two parts, wherein a first part of the address information ROW_addr2 is provided to the DRAM when the chip select signal CS is at a high logic level (i.e. "H"), and a second part of the address information ROW_addr2 is provided to the DRAM when the chip select signal CS is at a low logic level ("L"). In the embodiment, the first part of the address information ROW_addr2 comprises an index IND[1:0], a bank address BA[2:0], a trigger bit TRI, and the row address ROW[7], and the second part of the address information ROW_addr2 comprises the row address ROW[6:0]. It should be noted that the index IND[1:0] of the address information ROW_addr2 is different from that of the address information ROW_addr1. Furthermore, the bank address BA[2:0] of the address information ROW_addr2 is equal to that of the address information ROW_addr1. Moreover, only one trigger indicator is present among the address information ROW_add1 and ROW_addr2 when the address information ROW_add1 and ROW_addr2 comprise the trigger bit TRI. In one embodiment, the address information ROW_add1 and ROW_addr2 do not comprise the trigger bit TRI, and the DRAM obtains the row address corresponding to the activate command ACT according to the whole received address information. It should be noted that the configuration of address information ROW_add1 and ROW_addr2 in FIG. 4 is an example and is not meant to limit the invention.

Figure 5:
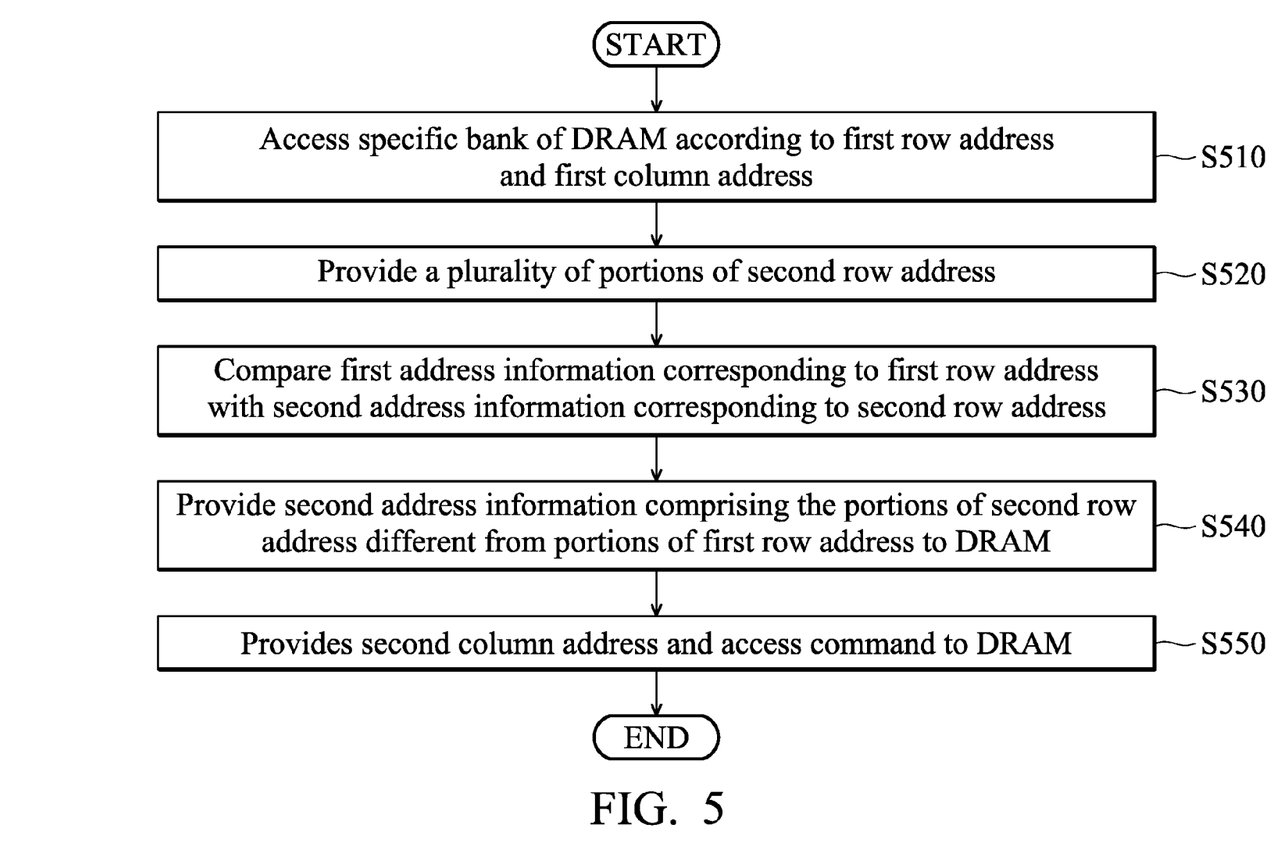
FIG. 5 shows an access method for a DRAM according to another embodiment of the invention, wherein the access method is performed by a controller.
Figure 6:
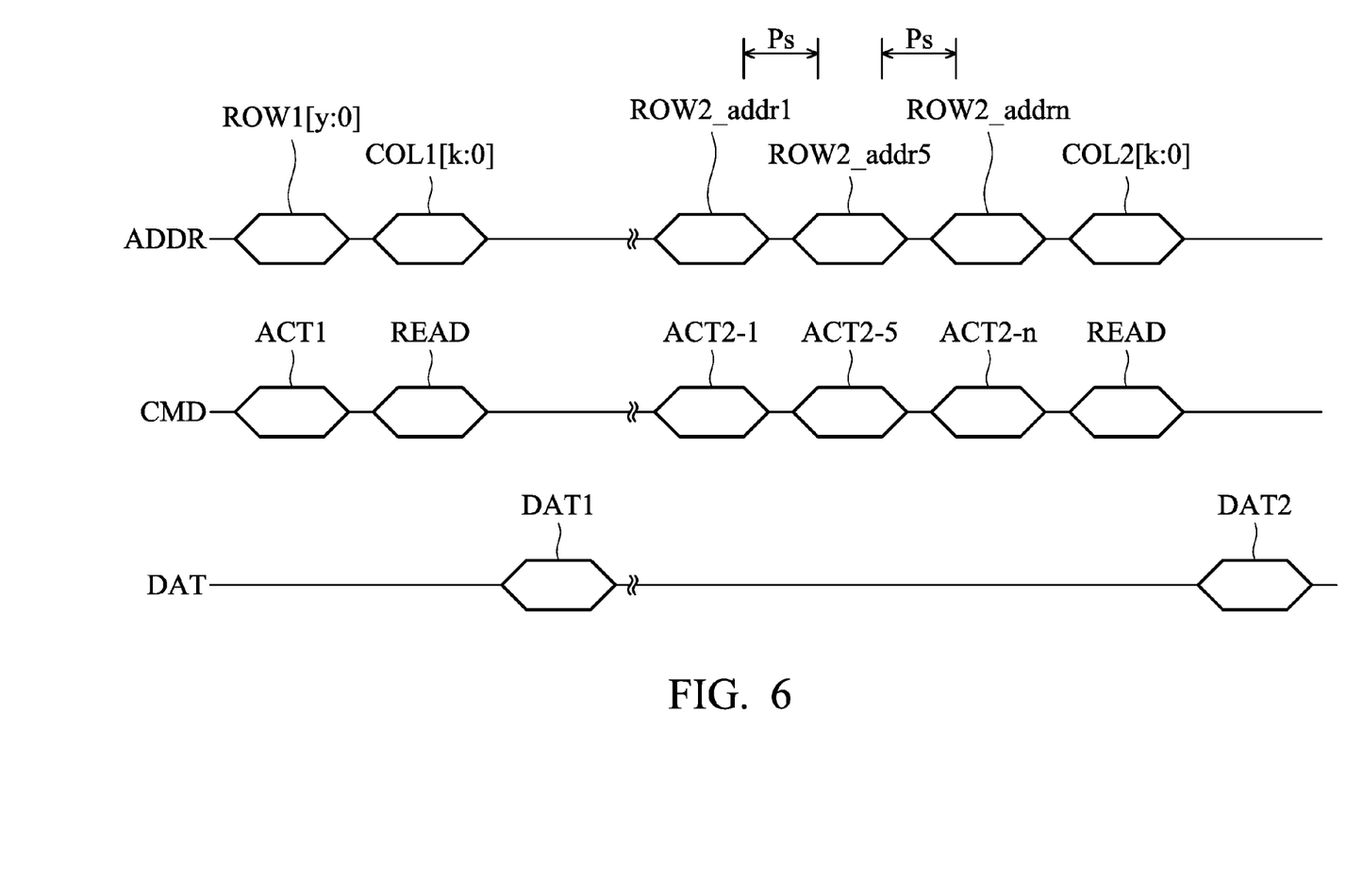
FIG. 6 shows a waveform illustrating the signals of the controller of FIG. 5 according to an embodiment of the invention.

FIG. 5 shows an access method for a DRAM (e.g. 120 of FIG. 1) according to another embodiment of the invention, wherein the access method is performed by a controller (e.g. 110 of FIG. 1). FIG. 6 shows a waveform illustrating the signals of the controller of FIG. 5 according to an embodiment of the invention. Referring to FIG. 5 and FIG. 6 together, first, in step S510, a specific bank of the DRAM is accessed according to a first row address ROW1[y:0] associated with a first activate command ACT1, and a first column address COL1[k:0] associated with an access command. In the embodiment, the first row address ROW1[y:0] and the first activate command ACT1 are transmitted to the DRAM from the controller according to the access method of FIG. 2. As described above, the first row address ROW1 [y:0] comprises a plurality of portions corresponding to a configuration of a specific index (e.g. IND[1:0] of FIG. 4), and first address information ROW1_addr1-ROW1_addrn comprising the portions of the first row address ROW1[y:0] associated with the corresponding sub-commands ACT1-1 to ACT1-n of the first activate command ACT1 are transmitted to the DRAM, as shown in FIG. 3. Next, in step S520, a second row address ROW2[y:0] corresponding to the specific bank comprises a plurality of portions according to the configuration of the specific index, and second address information ROW2_addr1-ROW2_addrn are generated according to the portions of the second row address ROW2 [y:0]. Next, in step S530, the controller compares the first address information ROW1_addr1-ROW1_addrn with the second address information ROW2_addr1-ROW2_addrn, so as to obtain the second address information that comprise the portions of the second row address ROW2[y:0] different from the portions of the first row address ROW1[y:0]. For example, for the first address information and the second address information both comprising the same index IND, the controller may compare the row address of the first address information with the row address of the second address information. Next, in step S540, the controller provides the second address information comprising the portions of the second row address ROW2[y:0] different from the portions of the first row address ROW1[y:0] to the DRAM. Simultaneously, the controller provides the corresponding sub-command of a second activate command ACT2 to the DRAM. For example, if the row addresses of the first and second address information corresponding to the same index IND are different, the controller provides the second address information associated with the corresponding sub-command of the second activate command ACT2 to the DRAM. On the contrary, if the row addresses of the first and second address information corresponding to the same index IND are identical, the controller does not provide the second address information to the DRAM. In the embodiment of FIG. 6, the second address information ROW2_addr1, ROW2_addr5 and ROW2_addrn are different from the first address information ROW1_addr1, ROW1_addr5 and ROW1_addrn. In other words, except for the second address information ROW2_addr1, ROW2_addr5 and ROW2_addrn, the other second address information of the second row address ROW2[y:0] are identical to the first address information of the first row address ROW1[y:0] for the same index IND. As described above, a specific address information is the second address information that comprises a trigger indicator or is last transmitted to the DRAM. Next, in step S550, the controller provides a second column address COL2[k:0] to the DRAM via the address bus. The second column address COL2[k:0] may be equal to or different from the first column address COL1[k:0]. Simultaneously, the controller provides an access command to the DRAM via the command bus. In the embodiment, the access command is a read command READ, the DRAM provides the data DAT2 corresponding to the second row address ROW2[y:0] and the second column address COL2[k:0] to the controller via the data bus in response to the read command READ. It is to be noted that the DRAM obtains the second row address ROW2[y:0] according to the first row address ROW1[y:0] and the second address information ROW2_addr1, ROW2_addr5 and ROW2_addrn.

Figure 7A:
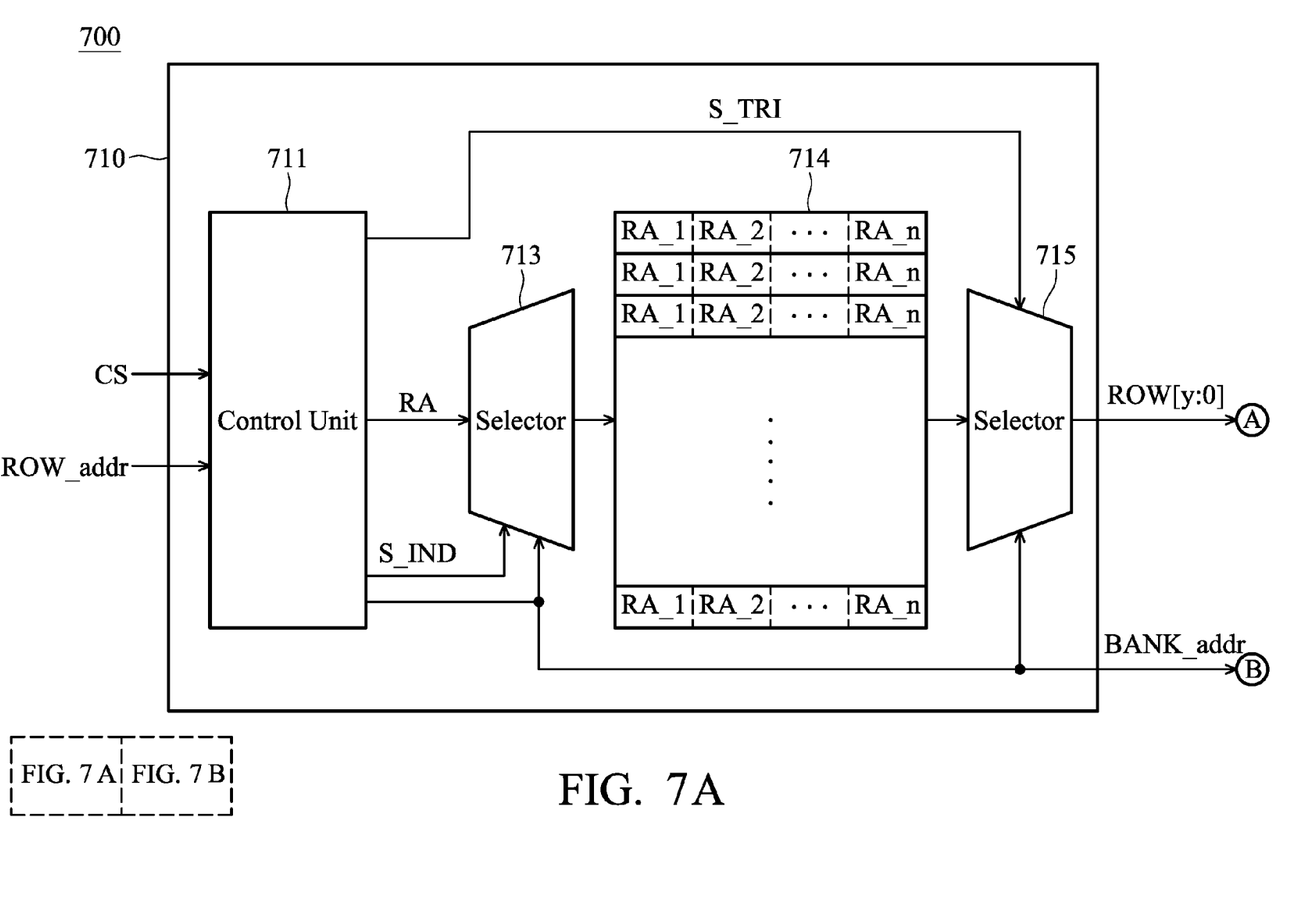
FIG. 7A and FIG. 7B show a DRAM according to an embodiment of the invention, wherein the DRAM is controlled by a controller capable of performing the access methods of FIG. 2 and FIG. 5.
Figure 7B:
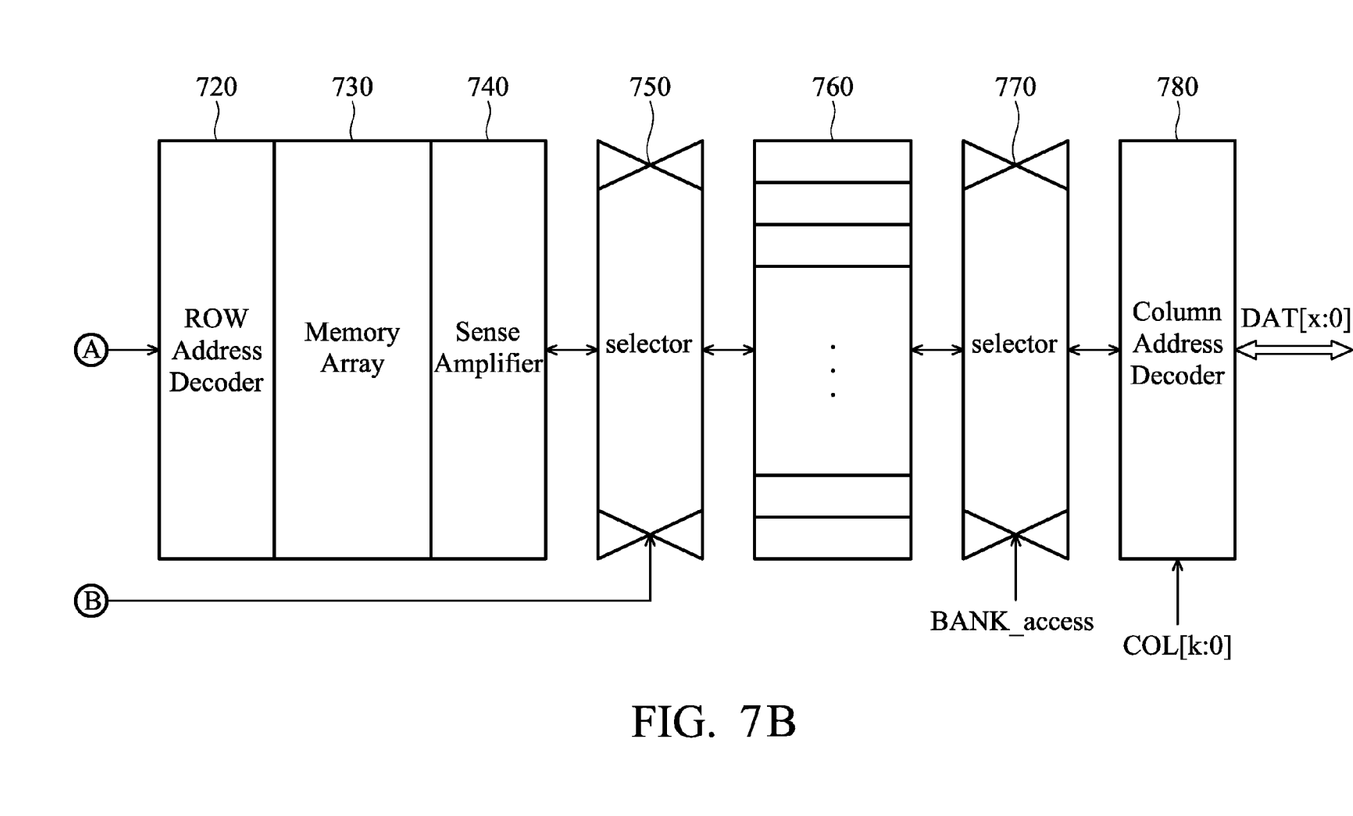

FIG. 7A and FIG. 7B show a DRAM 700 according to an embodiment of the invention, wherein the DRAM 700 is controlled by a controller capable of performing the access methods of FIG. 2 and FIG. 5. The DRAM 700 comprises an address combination circuit 710, a row address decoder 720, a memory array 730, a sense amplifier 740, a selector 750, a storage unit 760, a selector 770 and a column address decoder 780, wherein the memory array 730 comprises a plurality of memory cells. The address combination circuit 710 comprises a control unit 711, a selector 713, a storage unit 714, and a selector 715. The address combination circuit 710 provides a complete row address ROW[y:0] to the row address decoder 720 according to the address information ROW_addr and the chip select signal CS from the controller. Detailed description of the address combination circuit 710 will be described below. After obtaining the row address ROW[y:0], the row address decoder 720 decodes the row address ROW[y:0], and the memory array 730 provides the data corresponding to the decoded row address to the sense amplifier 740. According to a bank address BANK_addr from the address combination circuit 710, the selector 750 stores the data from the sense amplifier 740 into the storage unit 760. In the embodiment, the storage unit 760 comprises a plurality of sub-units, wherein each sub-unit corresponds to an individual bank address. For example, the selector 750 stores the data from the sense amplifier 740 into the sub-unit of the storage unit 760 corresponding to the bank address BANK_addr. Next, the DRAM 700 receives the column address COL[k:0] from the controller via the address bus and the access command READ from the controller via the command bus, wherein the access command READ comprises a bank address BANK_access and the bank address BANK_access is also identical to the bank address BANK_addr. According to the bank address BANK_access, the selector 770 reads the data corresponding to the row address ROW[y:0] from the storage unit 760, and provides the read data to the column address decoder 780. Next, the column address decoder 780 decodes the column address COL[k:0] to obtain the data DAT [x:0] according to the data from the selector 770, and provides the data DAT [x:0] to the controller via the data bus. On the contrary, if the access command is a write command, the column address decoder 780 decodes the column address COL[k:0], and the column address decoder 780 provides the data DAT[x:0] from the controller to the selector 770 according to the decoded column address. According to the bank address BANK_access, the selector 770 stores the data from the column address decoder 780 into the storage unit 760. Next, according to the bank address BANK_addr, the selector 750 reads the data corresponding to the column address COL[k:0] from the storage unit 760, and provides the data to the sense amplifier 740. Thus, the data DAT[x:0] from the controller is stored into the memory array 730 according to the row address ROW[y:0] and the column address COL[k:0].

Referring to FIG. 3 and FIG. 7A together, first, the DRAM 700 receives the address information ROW_addr1 corresponding to the sub-command ACT-1 of a activate command ACT and the chip select signal CS from the controller. According to the chip select signal CS, the control unit 711 decodes the address information ROW_addr1 to obtain a bank address BANK_addr, an index signal S_IND, and a portion of a row address RA. For example, when the chip select signal CS is at a high logic level (i.e. "H"), the control unit 711 can provide the bank address BANK_addr according to the bank address BA[2:0] of FIG. 4. Simultaneously, the control unit 711 can provide the index signal S_IND according to the index value of the index IND[1:0] of FIG. 4. Furthermore, due to there being no trigger indicator is present in the address information ROW_addr1, the control unit 711 will not provide a trigger signal S_TRI to the selector 715. Moreover, according to the row address ROW [15] obtained at a high logic level of the chip select signal CS and the row address ROW[14:8] obtained at a low logic level of the chip select signal CS, the control unit 711 can provide the portion of the row address RA (e.g. RA=ROW [15:8]) to the selector 713. According to the index signal S_IND and the bank address BANK_addr, the selector 713 stores the portion of the row address RA into the storage unit 714. In the embodiment, the storage unit 714 comprises a plurality of sub-units, wherein each sub-unit corresponds to an individual bank address. Furthermore, each sub-unit is divided into a plurality of portions RA_1-RA_n for storing the corresponding portion of the row addresses. Therefore, the selector 713 can provide the portion of the row address RA to the sub-unit of the storage unit 714 corresponding to the bank address BANK_addr and to the portion of the sub-unit corresponding to the index signal S_IND. Next, the DRAM 700 receives the subsequent address information ROW_addr2-ROW_addrn from the controller. Similarly, the control unit 711 can decode the received address information to provide the index signal S_IND and the bank address BANK_addr to the selector 713, so as to store the portion of row address RA into the storage unit 714. When the control unit 711 determines that the current received address information ROW_addr is the last address information of the activate command ACT or a trigger indicator is present in the current received address information ROW_addr, the control unit 711 provides the trigger signal S_TRI to the selector 715. According to the trigger signal S_TRI and the bank address BANK_addr, the selector 715 reads the complete row address ROW[y:0] from the storage unit 714, and provides the row address ROW[y:0] to the row address decoder 720. As described above, if a specific bank of the DRAM 700 is continuously accessed with a plurality of activate commands, only the portions of the row address, that are different from the row address of the previous activate command, will be provided to the DRAM 700 from the controller, because of the same portions of the row address of the specific bank have be stored in the storage unit 714.

Figure 8:
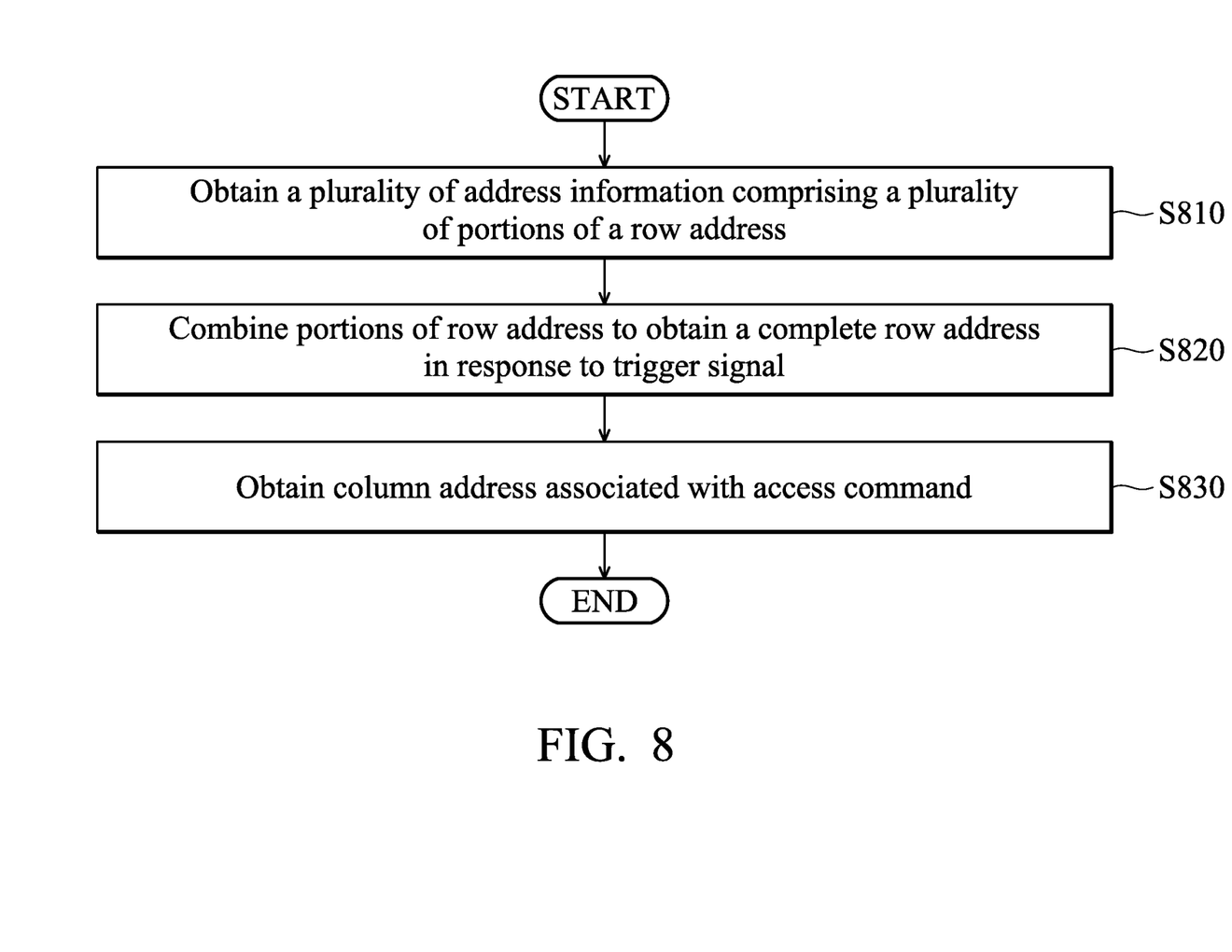
FIG. 8 shows an operating method for a DRAM according to an embodiment of the invention.

FIG. 8 shows an operating method for a DRAM according to an embodiment of the invention. In step S810, the DRAM obtains a plurality of address information comprising a plurality of portions of a row address associated with an activate command from a controller. Next, in step S820, the DRAM combines the obtained portions of the row address to obtain a complete address in response to a trigger signal. As described above, the DRAM provides the trigger signal when determining that the current received address information comprises a trigger indicator or the current received address information is the last address information for the activate command. Next, in step S830, the DRAM further obtains a column address associated with an access command from the controller. In response to the access command, the data from the controller is stored into the memory array of the DRAM or the data stored in the DRAM is provided to the controller according to the complete address and the column address.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An access method for a dynamic random access memory (DRAM), comprising:
providing a plurality of portions of a first row address of a first bank corresponding to a first activate command;
providing a plurality of first sub-commands of the first activate command via a command bus, and providing a plurality of portions of address information regarding the portions of the first row address via an address bus, wherein each portion of the address information comprises an individual portion of the first row address of the first bank, and each of the first sub-commands corresponds to an individual address information;
providing a specific sub-command of the first activate command via the command bus, and providing address information regarding a trigger indicator and a specific portion of the first row address via the address bus; and
providing a first access command corresponding to the first bank via the command bus after the first sub-commands are provided,
wherein the first access command is a read command or a write command, and a quantity of portions of the first row address of the first bank is equal to a quantity of first sub-commands and the specific sub-command.

2. The access method as claimed in claim 1, wherein in response to the first access command, memory cells of the first bank in the DRAM are accessed according to at least one portion of the first row address of the first bank corresponding to the first sub-command provided before the specific sub-command.

3. The access method as claimed in claim 1, wherein the step of providing the first sub-commands of the first activate command via the command bus further comprises:
separately sending the first sub-commands via the command bus,
wherein the first sub-commands are separated from each other by an idle phase, and no portion of the first row address of the first bank is provided in the idle phase.

4. The access method as claimed in claim 3, wherein in the idle phase, a no operation (NOP) instruction or a deselect instruction is performed.

5. The access method as claimed in claim 3, further comprising:
providing a second sub-command of a second activate command via the command bus in the idle phase; and
providing a portion of a second row address of a second bank via the address in the idle phase.

6. The access method as claimed in claim 1, wherein each portion of the address information further comprises a bank address of the first bank, and the bank addresses of the portions of address information are the same.

7. The access method as claimed in claim 1, further comprising:
providing at least one second sub-command corresponding to a second activate command via the command bus, and providing address information of a second row address via the address bus, wherein the address information of the second row address comprises an individual portion of the second row address of the first bank different from the first portions of the first row address in the first bank; and
providing a second access command corresponding to the second activate command via the command bus after the second sub-command and the address information of the second row address are provided,
wherein a quantity of second portions of the second row address is equal to a quantity of portions of the first row address.

8. The access method as claimed in claim 7, wherein in response to the second access command, memory cells of the specific bank in the DRAM are accessed according to the individual portion of the second row address and the portions of the first row address that are the same as the portions of the second row address.

9. The access method as claimed in claim 7, wherein the address information of the second row address further comprises a bank address of the specific bank.

10. An access method for a dynamic random access memory (DRAM), comprising:
providing a plurality of portions of a first row address of a first bank corresponding to a first activate command;
providing a plurality of first sub-commands of the first activate command via a command bus, and providing a plurality of portions of address information regarding the portions of the first row address via an address bus, wherein each portion of the address information comprises an individual portion of the first row address of the first bank, and each of the first sub-commands corresponds to an individual address information;
providing a specific sub-command of the first activate command via the command bus, and providing address information regarding a trigger indicator and a specific portion of the first row address via the address bus; and
providing a first access command corresponding to the first bank via the command bus after the first sub-commands are provided,
wherein each portion of the address information further comprises a bank address of the first bank, and the bank addresses of the portions of address information are the same.

11. An access method for a dynamic random access memory (DRAM), comprising:
providing a plurality of portions of a first row address of a first bank corresponding to a first activate command;
providing a plurality of first sub-commands of the first activate command via a command bus, and providing a plurality of portions of address information regarding the portions of the first row address via an address bus, wherein each portion of the address information comprises an individual portion of the first row address of the first bank, and each of the first sub-commands corresponds to an individual address information;
providing a specific sub-command of the first activate command via the command bus, and providing address information regarding a trigger indicator and a specific portion of the first row address via the address bus;
providing a first access command corresponding to the first bank via the command bus after the first sub-commands are provided;
providing at least one second sub-command corresponding to a second activate command via the command bus, and providing address information of a second row address via the address bus, wherein the address information of the second row address comprises an individual portion of the second row address of the first bank different from the first portions of the first row address in the first bank; and
providing a second access command corresponding to the second activate command via the command bus after the second sub-command and the address information of the second row address are provided, wherein a quantity of second portions of the second row address is equal to a quantity of portions of the first row address.

* * * * *